United States Patent
Husain et al.

(10) Patent No.: US 12,417,797 B2
(45) Date of Patent: Sep. 16, 2025

(54) NOR GATE BASED LOCAL ACCESS LINE DESELECT SIGNAL GENERATION

(71) Applicant: Intel Corporation, Santa Clara, CA (US)

(72) Inventors: Yasir Mohsin Husain, Folsom, CA (US); Everardo Flores, III, Penryn, CA (US); Neeladri Sain, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 638 days.

(21) Appl. No.: 17/725,384

(22) Filed: Apr. 20, 2022

(65) Prior Publication Data

US 2023/0343384 A1 Oct. 26, 2023

(51) Int. Cl.
*G11C 11/4094* (2006.01)
*G11C 11/404* (2006.01)
*G11C 11/408* (2006.01)
*H03K 19/20* (2006.01)

(52) U.S. Cl.
CPC ...... *G11C 11/4085* (2013.01); *G11C 11/4045* (2013.01); *G11C 11/4094* (2013.01); *H03K 19/20* (2013.01)

(58) Field of Classification Search
CPC ................................. G11C 11/4094
See application file for complete search history.

(56) References Cited

U.S. PATENT DOCUMENTS

2003/0123199 A1* 7/2003 Honda .............. B82Y 25/00
360/324.2

* cited by examiner

*Primary Examiner* — Hoai V Ho
(74) *Attorney, Agent, or Firm* — Alliance IP, LLC

(57) ABSTRACT

A memory device comprising a plurality of first global access lines, second global access lines, first local access lines, and second local access lines; and a plurality of memory cells, wherein a memory cell is coupled to one of the first local access lines and one of the second local access lines. The memory device further comprises a plurality of signal lines to communicate local access line select signals to control a plurality of select devices, wherein a select device selectively couples one of the first global access lines to one of the first local access lines; and a NOR gate to accept the plurality of local access line select signals as inputs and generate a plurality of local access line deselect signals to control a plurality of deselect devices, wherein a deselect device selectively couples one of the first local access lines to a deselect voltage.

20 Claims, 9 Drawing Sheets

NOR GATE BASED LOCAL ACCESS LINE DESELECT SIGNAL GENERATION

FIELD

The present disclosure relates in general to the field of computer development, and more specifically, to NOR gate based local access line deselect signal generation.

BACKGROUND

A storage device may include non-volatile memory, such as multi-stack 3D crosspoint memory arrays. Memory cells of the memory arrays may be programmed via access lines (e.g., wordlines and bitlines) of the memory array.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
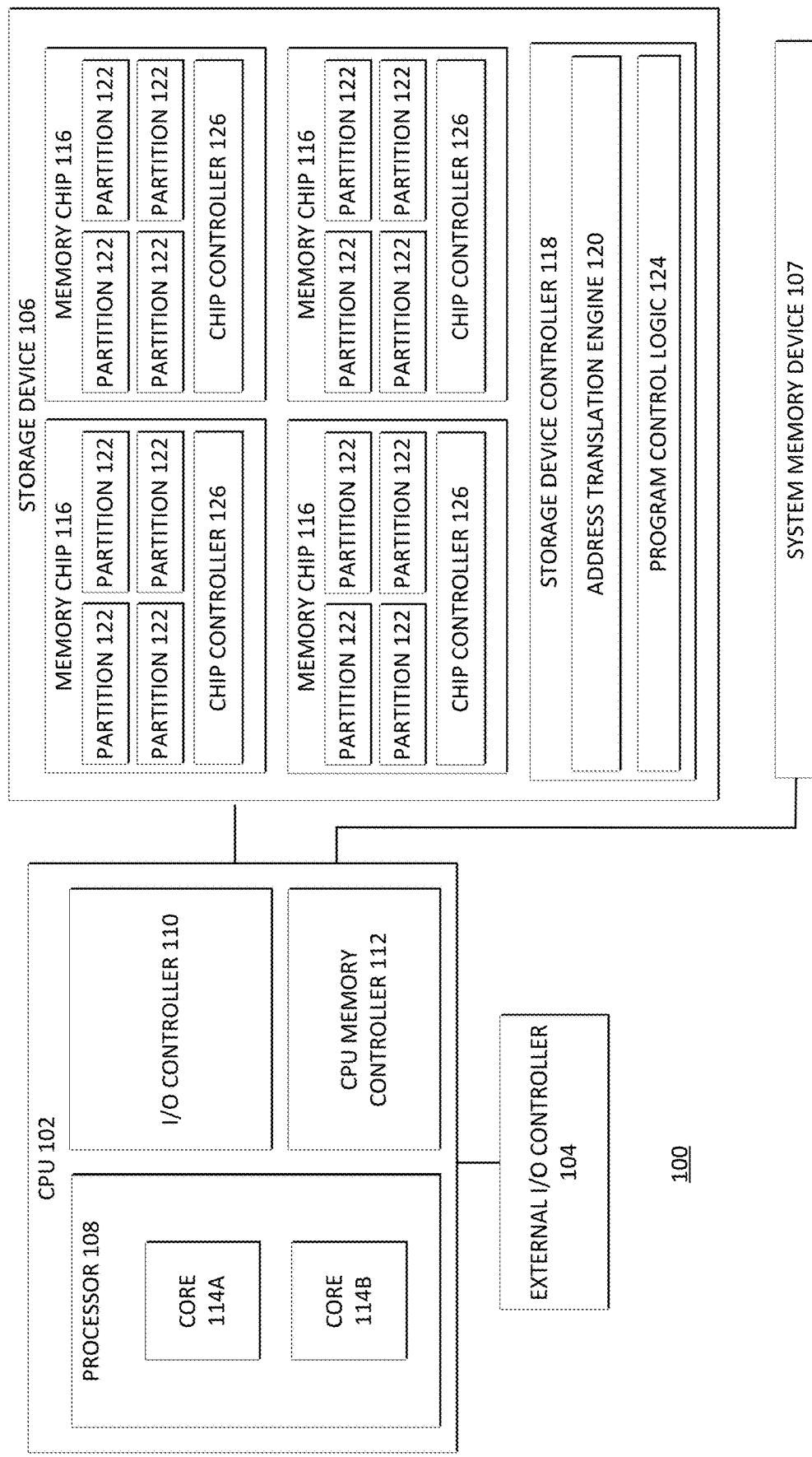
FIG. 1 illustrates components of a computer system in accordance with certain embodiments.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD) or a dual inline memory module (DIMM), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

The memory cells of a memory partition 122 may be coupled to access lines. Such access lines may include, e.g., global wordlines and bitlines and local wordlines and bitlines. A particular memory cell may be accessed via a particular local bitline (which may be coupled to a global bitline) and a particular local wordline (which may be coupled to a global wordline). Local bitline select devices and local bitline deselect devices may selectively couple local bitlines to respective global bitlines or a deselect voltage. Similarly, local wordline select devices and local wordline deselect devices may selectively couple local wordlines to respective global wordlines or a deselect voltage.

Various embodiments of the present disclosure provide a memory partition with select lines that are used to control select devices as well as deselect devices. By utilizing the same control lines to control select devices and deselect devices (as opposed to having dedicated lines for the select devices and dedicated lines for the deselect devices), the routing across the memory partition may be simplified (greatly reducing area occupied by the routing), the driver circuitry may be reduced, and/or the power utilized by the memory partition may be reduced (e.g., since an additional set of control lines does not need to be driven).

Returning again to FIG. 1, CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WI02 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122. In some embodiments, the memory partitions may be vertically stacked.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g., cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
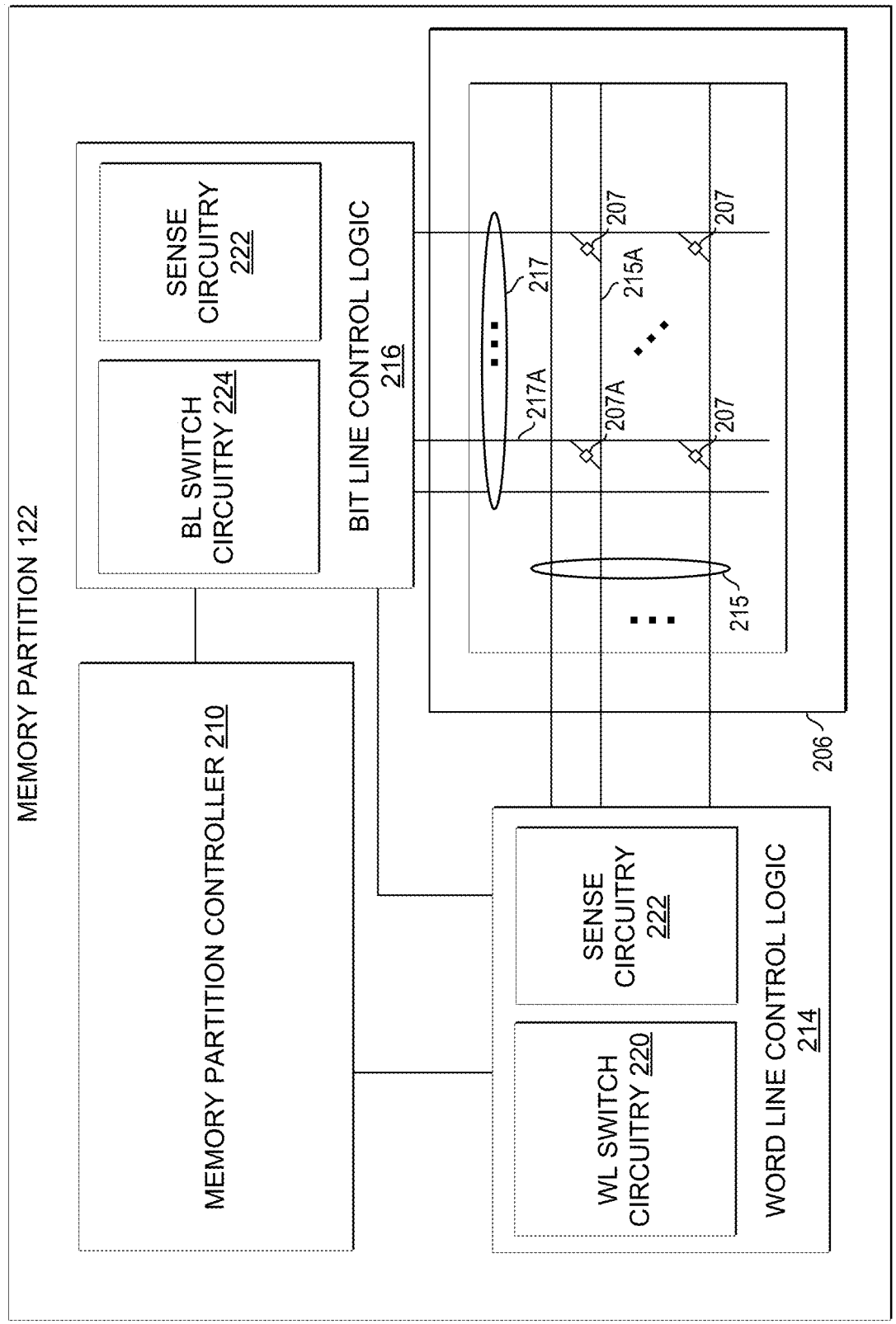
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs) (which may each be referred to as access lines), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222.

WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A dependent on a program state of the memory cell. A comparator such as a sense amplifier may compare icell with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
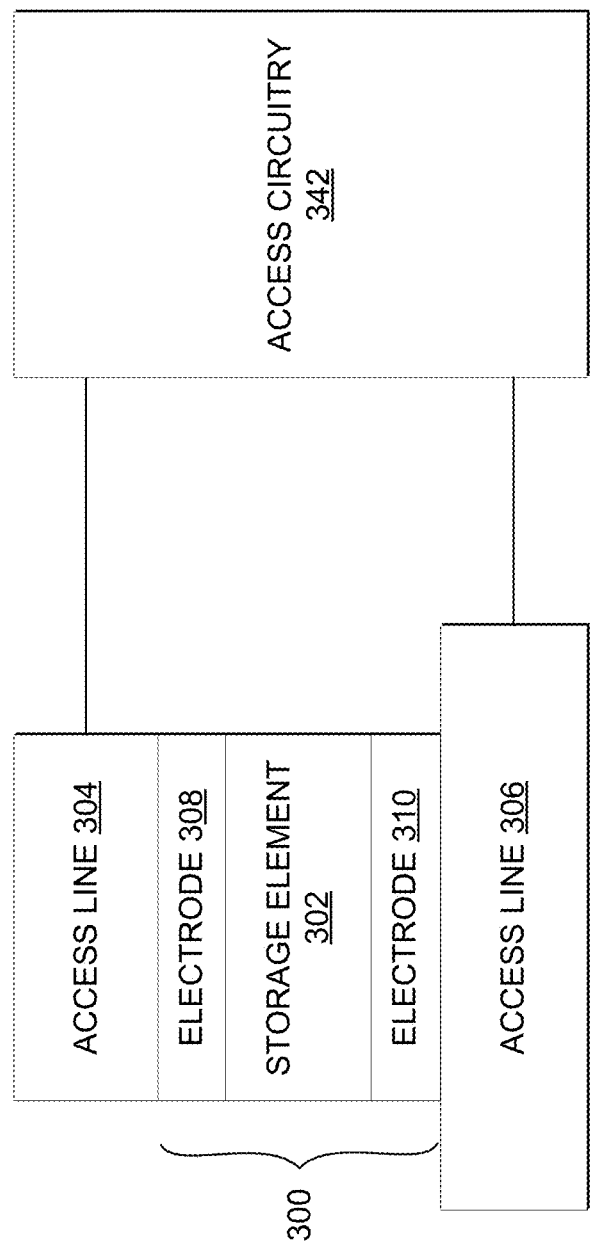
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage element 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage element 302 includes a self-selecting material that exhibits memory effects. A self-selecting material is a material that enables selection of a memory cell in an array without requiring a separate selector element (also referred to herein as selector device). Thus, storage element 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation).

Access circuitry 342 can store information in the memory cell 300 by causing the storage element 302 to be in a particular state. The storage element 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage element 302 may include any suitable material programmable to a plurality of states. In some embodiments, the storage element 302 may include a chalcogenide material comprising a chemical compound with at least one chalcogen ion, that is, an element from group 16 of the periodic table. For example, the storage element 302 may include one or more of: sulfur (S), selenium (Se), or tellurium (Te). Additionally or alternatively, in various embodiments, storage element 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage element 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage element 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage element 302) may be dopants. For example, the storage element 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage element 302) may include additional elements such as hydrogen (H), oxygen (O), nitrogen (N), chlorine (Cl), or fluorine (F), each in atomic or molecular forms. The storage element 302 may include other materials or dopants not explicitly listed. In some examples, the storage element (such as any of the materials described above) is a phase change material. In other examples, the storage element 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage element 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity and application of current for a duration of time, which causes the memory cell 300 to exhibit a particular threshold voltage at a subsequent reading voltage of a same or different polarity. In one such embodiment, the storage element 302 is a self-selecting material that can be programmed by inducing a threshold event.

Access circuitry 342 may write to or read a memory cell 300 by applying one or more pulses having a particular magnitude, pulse width, and polarity to the terminals (e.g., electrodes 308, 310) of the memory cell. The amplitude or width of a program pulse can vary depending on implementation. The pulse polarity may be positive or negative.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308 are disposed between storage element 302 and access lines 304, 306. Electrodes 308 electrically couple access lines 304, 306 to storage element 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

In one embodiment, conductive wordline or bitline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used to store one or more logical bits. Other embodiments can include memory cells having additional or different layers of material than illustrated in FIG. 3 (e.g., a selection device between the access line 304 and the storage element, a thin dielectric material between the storage material and access lines, another electrode (comprising any of the materials listed above or other suitable material) between a storage element and a select device, or other suitable configuration).

Figure 4:
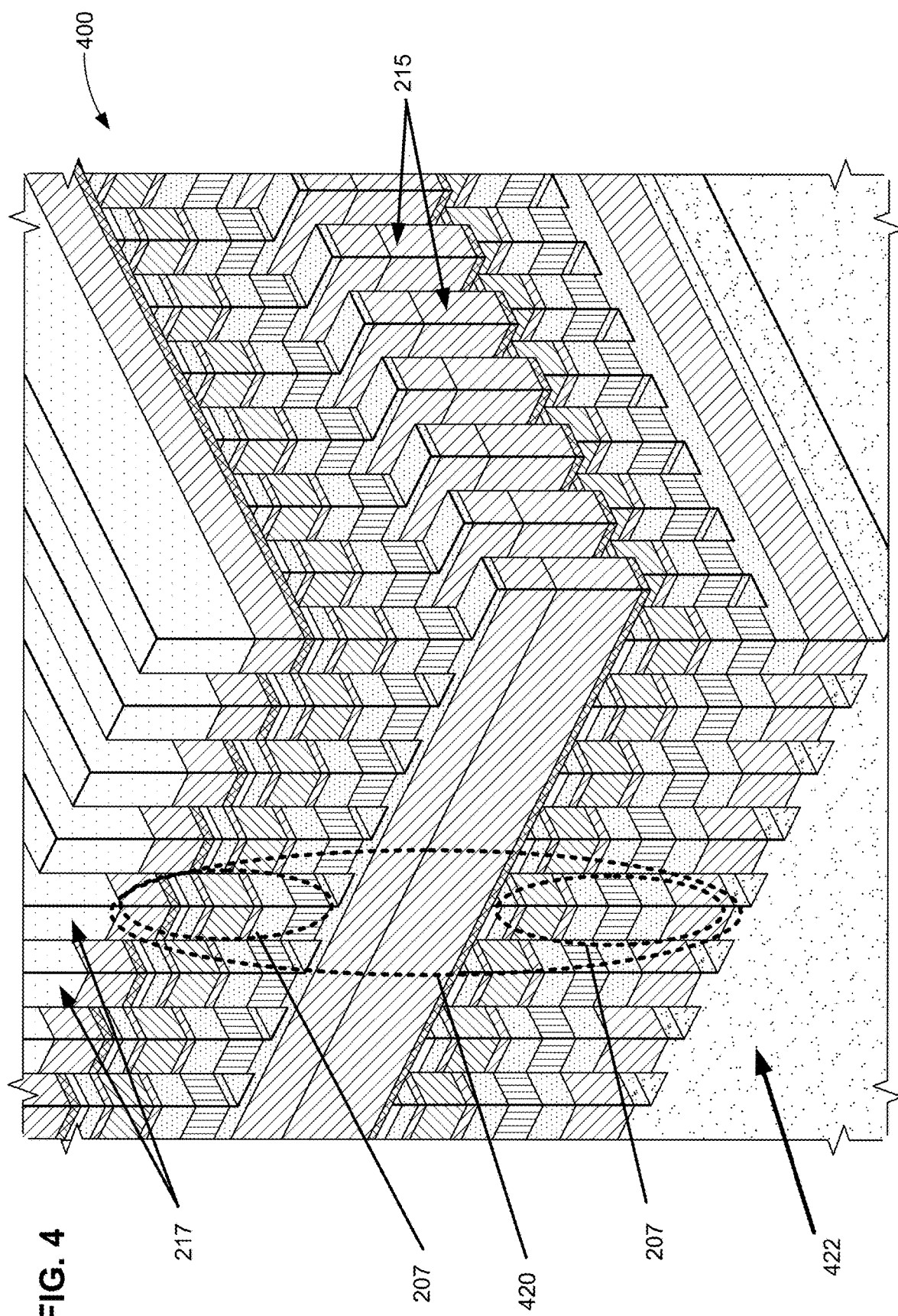
FIG. 4 illustrates a perspective view of portions of a three dimensional (3D) crosspoint memory stack in accordance with certain embodiments.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
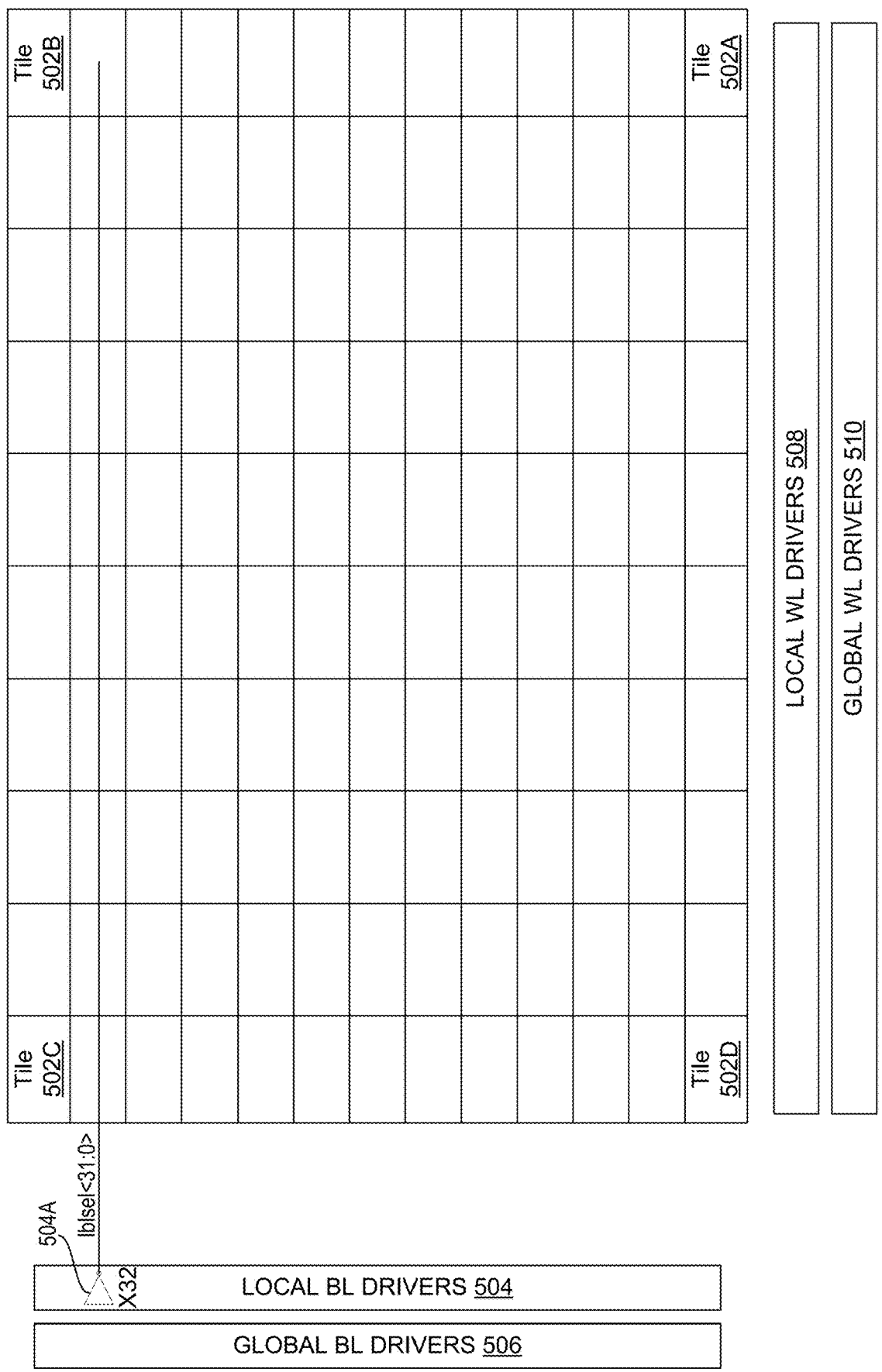
FIG. 5 illustrates a portion of a memory partition in accordance with certain embodiments.

FIG. 5 illustrates a portion of a memory partition (e.g., partition 122) in accordance with certain embodiments. The partition includes a plurality of tiles 502, local bitline (BL) drivers 504, global BL drivers 506, local wordline (WL) drivers 508, and global WL drivers 510.

In various embodiments, a memory chip (e.g., 116) may include a plurality of memory partitions, which in some embodiments may be vertically stacked. Each partition may include its own set of drivers 504, 506, 508, and 510.

Each tile 502 may include a plurality of memory cells that are each coupled to a respective bitline and wordline. In various embodiments, the tiles may be accessed in parallel based on an address supplied in association with a memory operation. For example, the same memory address may be applied to each tile of a partition during a read or write access to access a corresponding cell of each tile in parallel.

The drivers 504 and 506 may, e.g., be included within BL switch circuitry 224, while drivers 508 and 510 may, e.g., be included within WL switch circuitry 220. During a memory access operation, local BL drivers 504 may output local BL select signals to control which local bitline is selected, global BL drivers 506 may output global BL select signals to control which global bitline is selected, local WL drivers 508 may output local WL select signals to control which local WL is selected, and global WL drivers 510 may output global WL select signals to control which global WL is selected. A memory address may indicate the location of the particular cell in each tile 502 that is to be accessed and thus the memory address may dictate the values of the select signals output by the drivers 504, 506, 508, and 510.

In the illustrated embodiment, one of the local BL drivers (504A) is depicted as outputting 32 local bitline select (lblsel) signals. In other embodiments, any of the drivers depicted may output any suitable number of respective select signals (e.g., depending on the number of local or global access lines in the tiles 502). The local BL select signals output by a particular BL driver (e.g., 504A) may be provided to each tile of a group (e.g., row) of tiles 502. Thus, the signal lines carrying these select signals may be routed across multiple tiles (as shown by the lblsel lines spanning an entire row of tiles). Similarly, global BL select signals output by a particular global BL driver 506 may be provided to multiple tiles (e.g., an entire row). In a similar fashion, local WL select signals output by a particular WL driver 508 may be provided to each tile of a group (e.g., column) of tiles 502. Thus, the signal lines carrying these select signals may be routed across multiple tiles. Similarly, global WL select signals output by a particular global WL driver 510 may be provided to multiple tiles (e.g., an entire column).

In one embodiment, a local BL driver 504 may be supplied for each row of tiles (thus for the partition shown in FIG. 5, thirteen local BL drivers 504 may be present). In various embodiments, the local BL drivers 504 may each output the same values of their respective lblsel signals (e.g., as dictated by the memory address as the cell with the same address in each tile may be accessed simultaneously during a memory operation). In some examples, a global BL driver 506 may be supplied for each row of tiles, a local WL driver 508 may be supplied for each column of tiles, and/or a global WL driver 510 may be supplied for each column of tiles.

In an embodiment, the particular values of the select signals output by the drivers 504, 506, 508, and 510 result in a particular cell in each tile 502 being accessed. In some embodiments, the values of the local BL select signals may control which local bitlines are coupled to respective global bitlines, while the values of the local WL select signals may determine which local wordlines are coupled to respective global wordlines. The global BL and WL select signals may control which global bitline and global wordline are coupled to respective bias voltages used for the memory access operation.

Figure 6:
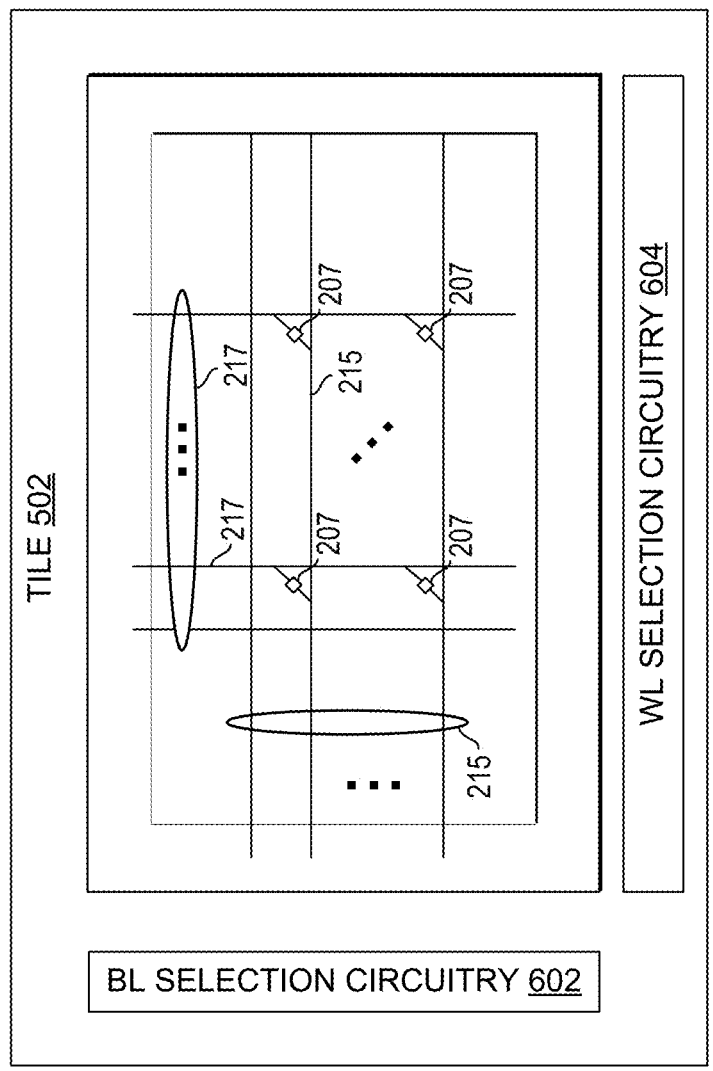
FIG. 6 illustrates a portion of a tile of a memory partition in accordance with certain embodiments.

FIG. 6 illustrates a portion of a tile 502 in accordance with certain embodiments. In this embodiment, tile 502 includes bitline (BL) selection circuitry 602, wordline (WL) selection circuitry 604, and a plurality of memory cells 207 coupled between respective wordlines 215 and bitlines 217.

Figure 7:
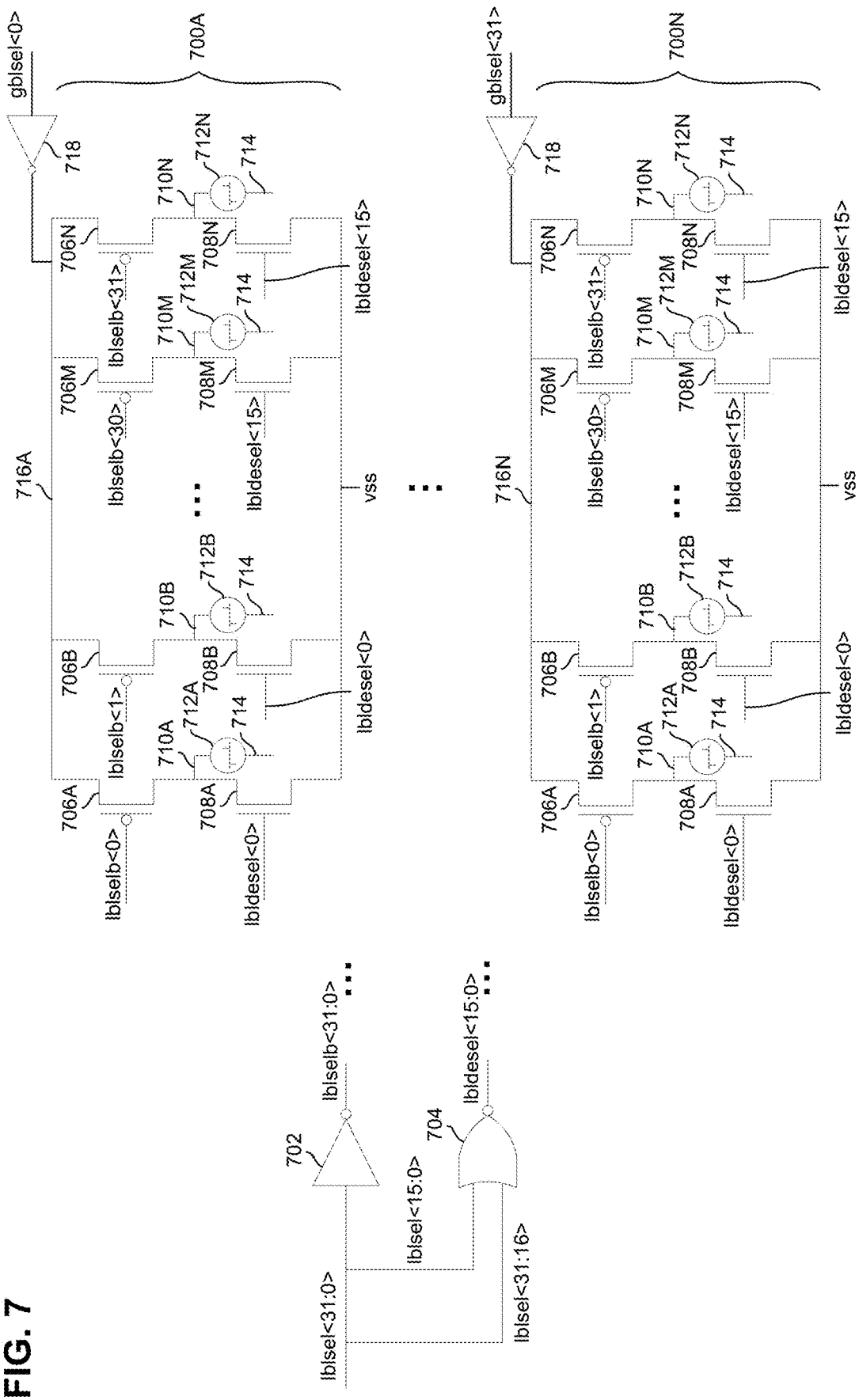
FIG. 7 illustrates bitline selection circuitry in accordance with certain embodiments.

The BL selection circuitry 602 may include circuitry to select a particular bitline 217 of the tile 502 based on the local and global BL selection signals. An example of such BL selection circuitry 602 is depicted in FIG. 7. For example, BL selection circuitry 602 may include local BL select devices and local BL deselect devices used to select or deselect the local bitlines during a memory access operation. In some embodiments, the local BL select devices and local BL deselect devices may be Metal Oxide Semiconductor Field Effect Transistor (MOSFET) devices or other similar devices.

WL selection circuitry 604 may include circuitry to select a particular wordline 215 of the tile 502 based on local and global WL selection signals. In some embodiments the WL selection circuitry 604 may have any suitable characteristics of the BL selection circuitry 602 or may be configured differently from the BL selection circuitry 602.

FIG. 7 illustrates bitline selection circuitry (e.g., 602) among other components of a tile in accordance with certain embodiments. In this embodiment, the bitline selection circuitry includes a local bitline select inverter 702, a local bitline deselect NOR gate 704, a plurality of local bitline select devices 706 (e.g., 706A-706N), a plurality of local bitline deselect devices 708 (e.g., 708A-708N), and a plurality of global bitline select inverters 718.

FIG. 7 also depicts a plurality of bitline networks 700 (e.g., 700A-700N) of a tile. Each bitline network 700 includes a global bitline 716 (e.g., 716A-N) selectively coupled to a plurality of local bitlines 710. For example, bitline network 700A includes global bitline 716A selectively coupled (through local bitline select devices 706A-N) to a plurality of local bitlines 710A-N. As another example, bitline network 700N includes global bitline 716N selectively coupled (through another set of local bitline select devices 706) to another set of local bitlines 710A-N. A distinct set of local bitlines 710 may be selectively coupled to each global bitline 716 of the tile 502. Each local bitline 710 is coupled to a respective plurality (e.g., column 712) of memory cells. For example, local bitline 710A is coupled to column 712A, local bitline 710M is coupled to column 712M, and local bitline 710N is coupled to column 712N. Each column 712 of memory cells may also be coupled to a plurality of wordlines 714 (in which a respective memory cell is coupled to the bitline and one of the wordlines). For example, a particular wordline may be coupled to a plurality of memory cells, with each memory cell coupled to a distinct local bitline of the various bitline networks 700 of the tile.

The local bitline select signals lblsel are provided as input to the bitline selection circuitry. In the embodiment depicted, there are 32 local bitline select signals, although any suitable number of local bitline select signals (e.g., each corresponding to a local bitline) may be used in other embodiments. The local bitline select signals pass through local bitline select inverter 702 to generate inverted local bitline select signals (lblselb<31:0>).

The inverted local bitline select signals are supplied to the local bitline select devices 706 (e.g., 706A-706N) of each bitline network of the tile. A particular inverted local bitline select signal may be coupled to a local bitline select device 706 in each bitline network 700. For example, lblselb<0> may be coupled to local bitline select device 706A that is coupled to global bitline 716A, local bitline select device 706A that is coupled to global bitline 716N, and other local bitline select devices 706A that are coupled to the other global bitlines 716 of the tile 502 (these other local bitline select devices 706A are not shown). As another example, lblselb<1> may be coupled to a local bitline select device 706B that is coupled to global bitline 716A, local bitline select device 706B that is coupled to global bitline 716N, and other local bitline select devices 706B that are coupled to the other global bitlines 716 of the tile 502 (these other local bitline select devices 706B are also not shown). Thus, the assertion of a particular local BL select signal may cause a local BL select device 706 in each bitline network 700 to turn on, thus coupling a respective global bitline 716 to a respective local bitline 710 in each set. For the local bitline 710 of the tile that is selected for the memory operation, the associated global bitline 716 of the same bitline network 700 will also be selected (while the other global bitlines 716 will not be selected) via its global bitline select signal such that the selected global bitline 716 will couple a bias voltage (e.g., through inverter 718) to the selected local bitline 710 via a local bitline select device 706.

In addition to controlling the local BL select devices 706, the local bitline select signals may also be used to control the local BL deselect devices 708 in order to couple and uncouple the local bitlines 710 to and from a deselect bias (such as vss, ground, or other suitable voltage). In the embodiment depicted, the local bitline select signals lblsel may pass through a NOR gate 704 to generate local bitline deselect signals lbldesel<15:0>. In this embodiment, a NOR operation is performed by NOR gate 704 on two of the local bitline select signals to generate one of the local bitline deselect signals. For example, a NOR operation may be performed on lblsel<31> and lblsel<15> to generate lbldesel<15>, a NOR operation may be performed on lblsel<30> and lblsel<14> to generate lbldesel<14>, and so on.

Figure 8:
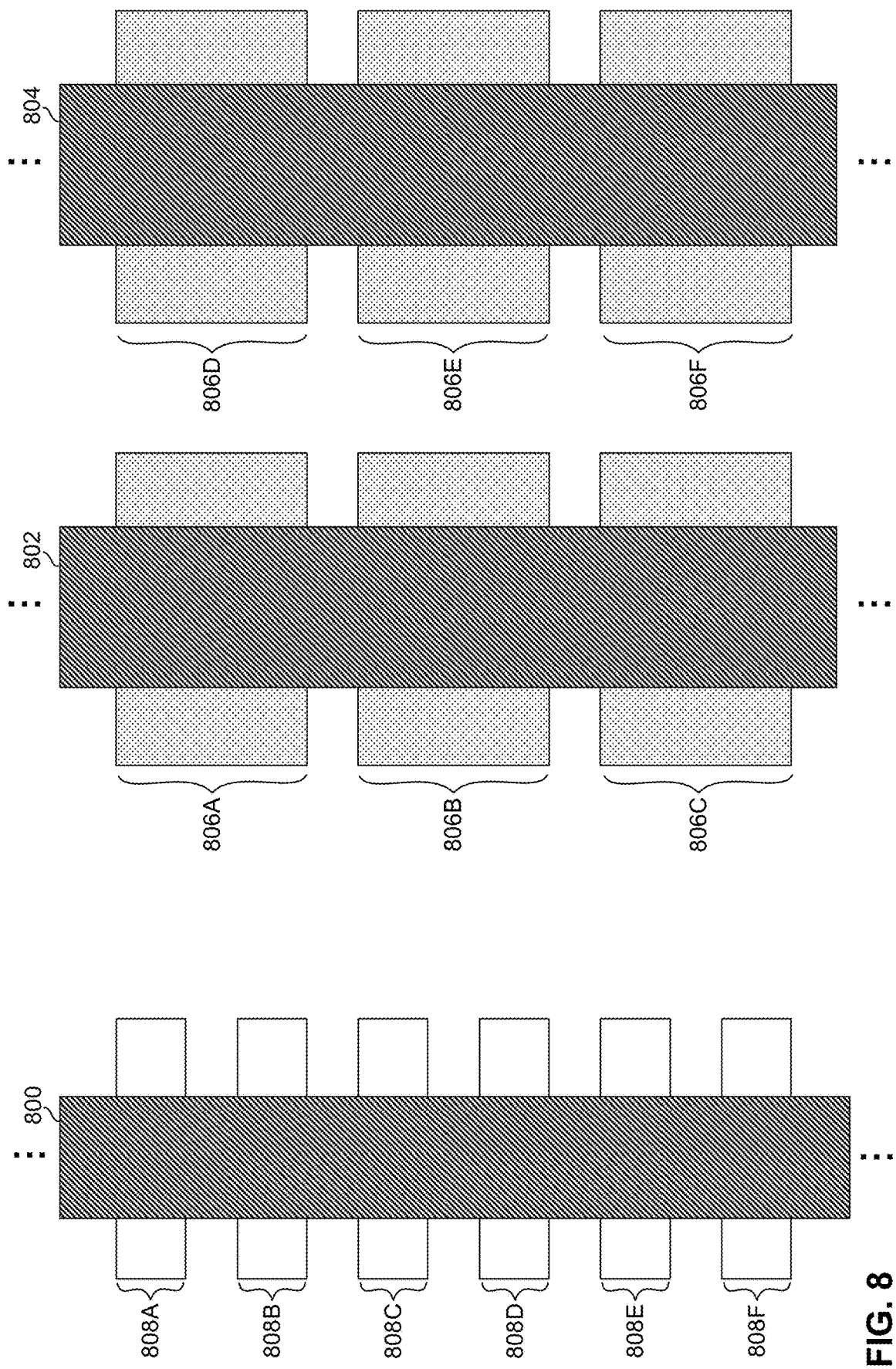
FIG. 8 illustrates a physical layout of selection and deselection devices in accordance with certain embodiments.

In the embodiment depicted, each local bitline deselect signal is used to control two local bitline deselect devices 708 of each bitline network 700. For example, lbldesel<0> controls deselect device 708A and 708B of the bitline networks 700, lbldesel<15> controls deselect devices 708M and 708N, and so on. FIG. 8 depicts a physical layout of devices consistent with this scheme.

FIG. 8 illustrates a physical layout of local bitline select devices 806 and deselect devices 808 in accordance with certain embodiments. In the depicted embodiment, in order to improve packing efficiency, the pitch of one local bitline select device 806 includes two local bitline deselect devices 808.

In the embodiment depicted, a plurality of local bitline deselect devices 808 are coupled to the same conductive line 800. These local bitline deselect devices 808 may include pairs of deselect devices, where each pair is in a different bitline network 700 and the conductive line 800 may communicate one of the lbldesel signals (or other signal to control the deselect devices) to the pairs of the deselect devices 808. For example, deselect device 808A and 808B may correspond respectively to deselect devices 708A and 708B of bitline network 700A, deselect devices 808C and 808D may correspond respectively to deselect devices 708A and 708B of a different bitline network 700B (not shown), and so on. Any other suitable layout arrangements are contemplated herein. For example, deselect device 808A may correspond to deselect device 708A of bitline network 700A, deselect device 808B may correspond to deselect device 708A of a bitline network 700B (not shown), deselect device 808C may correspond to deselect device 708A of a bitline network 700C (not shown), and so on; while a different series of deselect devices coupled to conductive line 800 could correspond to deselect devices 708B of the various bitline networks 700 of the tile.

Similarly, a plurality of local bitline select devices 806 (e.g., 806A-C) are coupled to a first conductive line 802 and a second plurality of local bitline select devices 806 (e.g., 806D-F) are coupled to a second conductive line 804. In one embodiment, the local bitline select devices coupled to a particular conductive line may each be in a different bitline network 700. For example, select device 806A may correspond to select device 706A of bitline network 700A, select device 806B may correspond to select device 706A of bitline network 700B (not shown), select device 806C may correspond to a select device 706A of bitline network 700C (not shown), and so on; while select device 806D may correspond to select device 706B of bitline network 700A, select device 806E may correspond to select device 706B of bitline network 700B (not shown), select device 806F may correspond to a select device 706B of bitline network 700C (not shown), and so on.

Because there are twice as many deselect devices 808 as select devices 806 per poly, twice as many control signals may be used for the select devices 806 as for the deselect devices 808. For example, one control signal may be communicated to conductive line 800 to control the deselect devices 808 coupled thereto, whereas two different control signals are communicated respectively to conductive lines 802 and 804 to control the select devices coupled thereto. This is consistent with FIG. 7, in which each lbldesel signal is provided to two deselect devices in each bitline network 700. Thus, for example, a single deselect signal (e.g., lbldesel<0>) may be communicated on conductive line 800 to be provided to deselect devices 708A and 708B of each bitline network 700 of the tile.

The implementation of the NOR gate 704 (e.g., in place of an inverter for the deselect signals) may result in reuse the local BL select signals to generate deselect signals within a tile to control the deselect devices 708, thus removing the need for deselect signals being routed across the tiles, freeing up valuable routing tracks, saving transition energy, and allowing omission of a deselect driver in the partition thus significantly reducing the chip area.

Referring again to FIG. 7. A particular memory cell is selected during a memory operation when the bitline coupled to the cell and the wordline coupled to the cell are both selected based on an address associated with the memory operation.

During a memory operation, a particular global bitline may be selected to be coupled to a bias voltage based on the value of its respective global bitline select signal (gblsel). The selected global bitline 716 is then coupled to a selected local bitline 710. In general, when a particular local bitline 710 is selected, the associated local bitline select device 706 (e.g., the select device selectively coupling the global bitline to that local bitline) is turned on to couple the global bitline to the local bitline and the associated local bitline deselect device 708 (e.g., the deselect device 708 selectively coupling the deselect bias voltage to that local bitline) is turned off to decouple the local bitline from the deselect voltage bias (e.g., vss, ground, or other suitable voltage).

For a deselected local bitline 710 that is physically adjacent to the selected bitline, the associated select device 706 is turned off and the associated deselect device 708 is turned on to couple the deselected local bitline 710 to the deselect bias to prevent false selection of this bitline (e.g., due to capacitive coupling with the selected bitline). For any other deselected bitline, the associated select device 706 is turned off and the associated deselect device 708 may be turned on or off. In some embodiments, the BL deselect devices of the non-selected local bitlines (with the exception of the other BL deselect device of the pair that receives the same deselect control signal) of the bitline network 700 (and corresponding BL deselect devices of the other bitline networks 700 of the tile) are turned on, coupling their respective local bitlines 710 to the deselect bias voltage.

As two local BL deselect devices 708 of the same bitline network may be coupled to the same local bitline deselect signal, another local bitline may be floating since that bitline will also not be coupled to the deselect bias voltage (e.g., vss). For example, when a local bitline 710A is selected, local bitline 710B may be floating since select device 706B will be off, and deselect device 708B will also be off In the physical layout of the bitline network 700, the bitlines coupled to these two BL deselect devices may be placed such that they are not adjacent to each other (so that the deselected bitline which is floating will not be falsely selected by the conditions on the selected bitline).

In various embodiments, the selection scheme for the wordline may be similar to the selection schemes described above with respect to the bitlines. For example, an inverter and NOR gate similar to 702 and 704 in conjunction with wordline select and deselect devices (e.g., similar to devices 706 and 708) to select a local wordline to couple to a global wordline. In various embodiments, the same structure shown in FIG. 7 (or variations thereof) may be used to select wordlines (thus FIG. 7 may depict a selection architecture for any suitable access line, whether bitline or wordline).

In other embodiments, the arrangement of the select and deselect devices may be different such that the selection architecture for a particular type of access line is different. For example, the pitch of one local wordline select device may include one local wordline deselect device and each wordline select device and wordline deselect device of a wordline network (e.g., that has a similar structure to a bitline network 700) may receive its own control signal (e.g., instead of a single signal controlling two deselect devices). In some embodiments, the wordline networks may utilize a NOR gate structure similar to that shown in FIG. 7, while the bitline networks utilize a different structure (e.g., each select device 706 and deselect device 708 of a bitline network may receive their own control signals).

Figure 9:
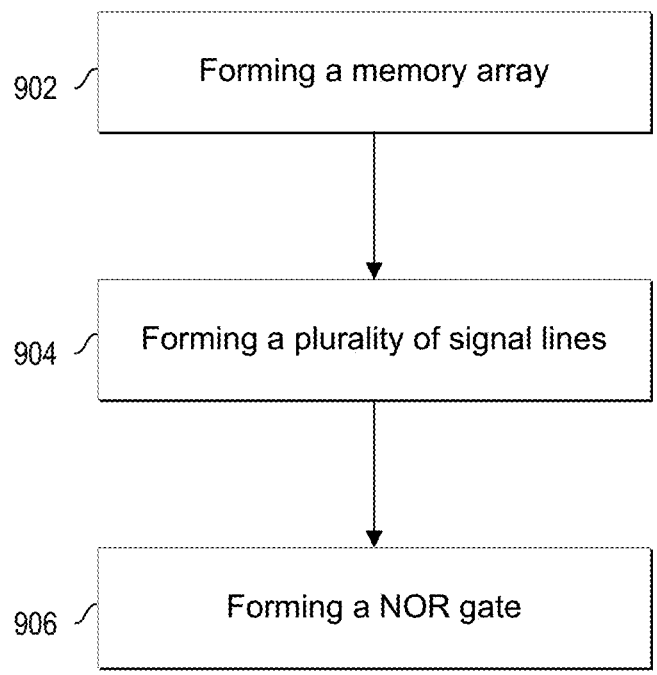
FIG. 9 is a flow for forming a portion of a memory partition in accordance with certain embodiments.

FIG. 9 is a flow for forming a portion of a memory partition in accordance with certain embodiments. At 902, a memory array is formed. The memory array comprises a plurality of first global access lines, second global access lines, first local access lines, and second local access lines; and a plurality of memory cells, wherein a memory cell is coupled to one of the first local access lines and one of the second local access lines. At 904, signal lines are formed. The signal lines are to communicate local access line select signals to control a plurality of select devices, wherein a select device selectively couples one of the first global access lines to one of the first local access lines. At 906, a NOR gate is formed. The NOR gate may accept the plurality of local access line select signals as inputs and generate a plurality of local access line deselect signals to control a plurality of deselect devices, wherein a deselect device selectively couples one of the first local access lines to a deselect voltage.

Although various examples herein depict memory cells and access line selection circuitry of a 3D crosspoint array, the features described herein may be utilized in any suitable memory architecture which utilize electrodes and access lines (e.g., where a memory cell is coupled to at least one electrode), including, but not limited to, any of the memory types described herein where applicable.

The flows described herein are merely representative of operations that may occur in particular embodiments. Some of the operations illustrated in the FIGs. may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, wordline control logic 214, bitline control logic 216, WL switch circuitry 220, BL switch circuitry 224, access circuitry 342, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g., reset, while an updated value potentially includes a low logical value, e.g., set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 includes a memory device comprising a memory array comprising a plurality of first global access lines, second global access lines, first local access lines, and second local access lines; and a plurality of memory cells, wherein a memory cell is coupled to one of the first local access lines and one of the second local access lines; a plurality of signal lines to communicate local access line select signals to control a plurality of select devices, wherein a select device selectively couples one of the first global access lines to one of the first local access lines; and a NOR gate to accept the plurality of local access line select signals as inputs and generate a plurality of local access line deselect signals to control a plurality of deselect devices, wherein a deselect device selectively couples one of the first local access lines to a deselect voltage bias.

Example 2 includes the subject matter of Example 1, and wherein the first global access lines comprise global bitlines, the second global access lines comprise global wordlines, the first local access lines comprise local bitlines, and the second local access lines comprise local wordlines.

Example 3 includes the subject matter of any of Examples 1 and 2, and wherein the first global access lines comprise global wordlines, the second global access lines comprise global bitlines, the first local access lines comprise local wordlines, and the second local access lines comprise local bitlines.

Example 4 includes the subject matter of any of Examples 1-3, and wherein the plurality of select devices comprise P-type metal oxide semiconductor field effect transistors (MOSFETs) and the plurality of deselect devices comprise N-type MOSFETs.

Example 5 includes the subject matter of any of Examples 1-4, and wherein the memory device comprises a plurality of tiles, wherein each tile of a row of tiles includes a respective NOR gate to accept the plurality of local access line select signals as inputs and generate a respective plurality of local access line deselect signals to control a respective plurality of deselect devices of the respective tile.

Example 6 includes the subject matter of any of Examples 1-5, and wherein each local access line deselect signal of the plurality of local access line deselect signals is coupled to two deselect devices of an access line network coupled to one of the first global access lines.

Example 7 includes the subject matter of any of Examples 1-6, and wherein the NOR gate is to generate each local access line deselect signal by performing a NOR operation on a distinct pair of the local access line select signals.

Example 8 includes the subject matter of any of Examples 1-7, and wherein the deselect voltage bias is ground.

Example 9 includes the subject matter of any of Examples 1-8, and further including a plurality of memory chips, wherein a memory chip of the plurality of memory chips comprises the memory array, the plurality of signal lines, and the NOR gate.

Example 10 includes the subject matter of any of Examples 1-9, and further including a memory controller to communicate with the plurality of memory chips.

Example 11 includes the subject matter of any of Examples 1-10, and wherein the memory device comprises a solid state drive.

Example 12 includes the subject matter of any of Examples 1-11, and wherein the memory device comprises a dual in-line memory module.

Example 13 includes a method comprising forming a memory array comprising a plurality of first global access lines, second global access lines, first local access lines, and second local access lines; and a plurality of memory cells, wherein a memory cell is coupled to one of the first local access lines and one of the second local access lines; forming a plurality of signal lines to communicate local access line select signals to control a plurality of select devices, wherein a select device selectively couples one of the first global access lines to one of the first local access lines; and forming a NOR gate to accept the plurality of local access line select signals as inputs and generate a plurality of local access line deselect signals to control a plurality of deselect devices, wherein a deselect device selectively couples one of the first local access lines to a deselect voltage.

Example 14 includes the subject matter of Example 13, and wherein the first global access lines comprise global bitlines, the second global access lines comprise global wordlines, the first local access lines comprise local bitlines, and the second local access lines comprise local wordlines.

Example 15 includes the subject matter of any of Examples 13 and 14, and wherein the first global access lines comprise global wordlines, the second global access lines comprise global bitlines, the first local access lines comprise local wordlines, and the second local access lines comprise local bitlines.

Example 16 includes the subject matter of any of Examples 13-15, and wherein the plurality of select devices comprise P-type metal oxide semiconductor field effect transistors (MOSFETs) and the plurality of deselect devices comprise N-type MOSFETs.

Example 17 includes the subject matter of any of Examples 13-16, and further including forming a plurality of tiles, wherein each tile of a row of tiles includes a respective NOR gate to accept the plurality of local access line select signals as inputs and generate a respective plurality of local access line deselect signals to control a respective plurality of deselect devices of the respective tile.

Example 18 includes the subject matter of any of Examples 13-17, and wherein each local access line deselect signal of the plurality of local access line deselect signals is coupled to two deselect devices of an access line network coupled to one of the first global access lines.

Example 19 includes the subject matter of any of Examples 13-18, and wherein the NOR gate is to generate each local access line deselect signal by performing a NOR operation on a distinct pair of the local access line select signals.

Example 20 includes the subject matter of any of Examples 13-19, and wherein the deselect voltage bias is ground.

Example 21 includes the subject matter of any of Examples 13-20, and further including forming a plurality of memory chips, wherein a memory chip of the plurality of memory chips comprises the memory array, the plurality of signal lines, and the NOR gate.

Example 22 includes the subject matter of any of Examples 13-21, further comprising forming a memory controller to communicate with the plurality of memory chips.

Example 23 includes a system comprising a memory chip comprising a memory array comprising a plurality of first global access lines, second global access lines, first local access lines, and second local access lines; and a plurality of memory cells, wherein a memory cell is coupled to one of the first local access lines and one of the second local access lines; a plurality of signal lines to communicate local access line select signals to control a plurality of select devices, wherein a select device selectively couples one of the first global access lines to one of the first local access lines; and a NOR gate to accept the plurality of local access line select signals as inputs and generate a plurality of local access line deselect signals to control a plurality of deselect devices, wherein a deselect device selectively couples one of the first local access lines to a deselect voltage.

Example 24 includes the subject matter of Example 23, and further including a second memory chip and a controller coupled to the memory chip and the second memory chip.

Example 25 includes the subject matter of any of Examples 23 and 24, and further including a processor to generate data to be stored by the memory array, the processor to couple to the memory chip through a storage device controller of a storage drive comprising the memory chip.

Example 26 includes the subject matter of any of Examples 23-25, and further including one or more of a battery communicatively coupled to the processor, a display communicatively coupled to the processor, or a network interface communicatively coupled to the processor.

Example 27 includes the subject matter of any of Examples 23-26, and wherein the first global access lines comprise global bitlines, the second global access lines comprise global wordlines, the first local access lines comprise local bitlines, and the second local access lines comprise local wordlines.

Example 28 includes the subject matter of any of Examples 23-27, and wherein the first global access lines comprise global wordlines, the second global access lines comprise global bitlines, the first local access lines comprise local wordlines, and the second local access lines comprise local bitlines.

Example 29 includes the subject matter of any of Examples 23-28, and wherein the plurality of select devices comprise P-type metal oxide semiconductor field effect transistors (MOSFETs) and the plurality of deselect devices comprise N-type MOSFETs.

Example 30 includes the subject matter of any of Examples 23-29, and wherein the memory device comprises a plurality of tiles, wherein each tile of a row of tiles includes a respective NOR gate to accept the plurality of local access line select signals as inputs and generate a respective plurality of local access line deselect signals to control a respective plurality of deselect devices of the respective tile.

Example 31 includes the subject matter of any of Examples 23-30, and wherein each local access line deselect signal of the plurality of local access line deselect signals is coupled to two deselect devices of an access line network coupled to one of the first global access lines.

Example 32 includes the subject matter of any of Examples 23-31, and wherein the NOR gate is to generate each local access line deselect signal by performing a NOR operation on a distinct pair of the local access line select signals.

Example 33 includes the subject matter of any of Examples 23-32, and wherein the deselect voltage bias is ground.

What is claimed is:

1. A memory device comprising:
   a memory array comprising:
      a plurality of first global access lines, second global access lines, first local access lines, and second local access lines; and
      a plurality of memory cells, wherein a memory cell is coupled to one of the first local access lines and one of the second local access lines;
   a plurality of signal lines to communicate local access line select signals to control a plurality of select devices, wherein a select device selectively couples one of the first global access lines to one of the first local access lines; and
   a NOR gate to accept the plurality of local access line select signals as inputs and generate a plurality of local access line deselect signals to control a plurality of deselect devices, wherein a deselect device selectively couples one of the first local access lines to a deselect voltage bias.

2. The memory device of claim 1, wherein the first global access lines comprise global bitlines, the second global access lines comprise global wordlines, the first local access lines comprise local bitlines, and the second local access lines comprise local wordlines.

3. The memory device of claim 1, wherein the first global access lines comprise global wordlines, the second global access lines comprise global bitlines, the first local access lines comprise local wordlines, and the second local access lines comprise local bitlines.

4. The memory device of claim 1, wherein the plurality of select devices comprise P-type metal oxide semiconductor field effect transistors (MOSFETs) and the plurality of deselect devices comprise N-type MOSFETs.

5. The memory device of claim 1, wherein the memory device comprises a plurality of tiles, wherein each tile of a row of tiles includes a respective NOR gate to accept the plurality of local access line select signals as inputs and generate a respective plurality of local access line deselect signals to control a respective plurality of deselect devices of the respective tile.

6. The memory device of claim 1, wherein each local access line deselect signal of the plurality of local access line deselect signals is coupled to two deselect devices of an access line network coupled to one of the first global access lines.

7. The memory device of claim 1, wherein the NOR gate is to generate each local access line deselect signal by performing a NOR operation on a distinct pair of the local access line select signals.

8. The memory device of claim 1, wherein the deselect voltage bias is ground.

9. The memory device of claim 1, further comprising a plurality of memory chips, wherein a memory chip of the plurality of memory chips comprises the memory array, the plurality of signal lines, and the NOR gate.

10. The memory device of claim 9, further comprising a memory controller to communicate with the plurality of memory chips.

11. The memory device of claim 1, wherein the memory device comprises a solid state drive.

12. The memory device of claim 1, wherein the memory device comprises a dual in-line memory module.

13. A method comprising:
forming a memory array comprising:
- a plurality of first global access lines, second global access lines, first local access lines, and second local access lines; and
- a plurality of memory cells, wherein a memory cell is coupled to one of the first local access lines and one of the second local access lines;

forming a plurality of signal lines to communicate local access line select signals to control a plurality of select devices, wherein a select device selectively couples one of the first global access lines to one of the first local access lines; and forming a NOR gate to accept the plurality of local access line select signals as inputs and generate a plurality of local access line deselect signals to control a plurality of deselect devices, wherein a deselect device selectively couples one of the first local access lines to a deselect voltage.

14. The method of claim 13, wherein the first global access lines comprise global bitlines, the second global access lines comprise global wordlines, the first local access lines comprise local bitlines, and the second local access lines comprise local wordlines.

15. The method of claim 13, wherein each local access line deselect signal of the plurality of local access line deselect signals is coupled to two deselect devices of an access line network coupled to one of the first global access lines.

16. The method of claim 13, wherein the NOR gate is to generate each local access line deselect signal by performing a NOR operation on a distinct pair of the local access line select signals.

17. A system comprising:
a memory chip comprising:
- a memory array comprising:
  - a plurality of first global access lines, second global access lines, first local access lines, and second local access lines; and
  - a plurality of memory cells, wherein a memory cell is coupled to one of the first local access lines and one of the second local access lines;
- a plurality of signal lines to communicate local access line select signals to control a plurality of select devices, wherein a select device selectively couples one of the first global access lines to one of the first local access lines; and
- a NOR gate to accept the plurality of local access line select signals as inputs and generate a plurality of local access line deselect signals to control a plurality of deselect devices, wherein a deselect device selectively couples one of the first local access lines to a deselect voltage.

18. The system of claim 17, further comprising a second memory chip and a controller coupled to the memory chip and the second memory chip.

19. The system of claim 17, further comprising a processor to generate data to be stored by the memory array, the processor to couple to the memory chip through a storage device controller of a storage drive comprising the memory chip.

20. The system of claim 19, further comprising one or more of: a battery communicatively coupled to the processor, a display communicatively coupled to the processor, or a network interface communicatively coupled to the processor.

* * * * *